United States Patent
Kang et al.

(10) Patent No.: US 6,190,934 B1
(45) Date of Patent: Feb. 20, 2001

(54) LIQUID CRYSTAL DISPLAY DEVICE AND A METHOD FOR MANUFACTURING THE SAME

(75) Inventors: Sung Gu Kang; Jung Chul Huh, both of Kumi-shi; Jeom Jae Kim, Dongdaemoon-ku, all of (KR)

(73) Assignee: LG.Philips LCD Co., Ltd., Seoul (KR)

( * ) Notice: Under 35 U.S.C. 154(b), the term of this patent shall be extended for 0 days.

(21) Appl. No.: 09/109,977

(22) Filed: Jul. 2, 1998

(30) Foreign Application Priority Data

Jul. 4, 1997 (KR) .................................................. 97-31123

(51) Int. Cl.[7] .................................................. H01L 21/00
(52) U.S. Cl. ........................... 438/30; 438/149; 349/139; 349/143; 349/149
(58) Field of Search .................. 438/29, 30, 38, 438/149; 349/149, 139, 143

(56) References Cited

U.S. PATENT DOCUMENTS

| | | | | |
|---|---|---|---|---|
| 5,550,066 | * | 8/1996 | Tang et al. .............................. | 438/29 |
| 5,907,379 | * | 5/1999 | Kim et al. .............................. | 349/141 |
| 5,968,850 | * | 10/1999 | Jeong et al. ........................... | 438/754 |
| 6,008,065 | * | 12/1999 | Lee et al. ............................... | 438/30 |
| 6,028,652 | * | 2/2000 | Dohjo et al. ........................... | 349/139 |
| 6,081,308 | * | 6/2000 | Jeong et al. ........................... | 349/42 |

FOREIGN PATENT DOCUMENTS 5-323375    12/1993    (JP) .

OTHER PUBLICATIONS

Yutaka et al, English abstract of JP 5–323375, Dec. 7, 1993.*

* cited by examiner

*Primary Examiner*—Carl Whitehead, Jr.
*Assistant Examiner*—Jamie L. Davis

(57) ABSTRACT

A method of manufacturing an active panel results in a gate pad being formed so as to prevent being damaged by a probe pin during an auto probe testing process. An active panel made by the method includes a pad including a first conductive material an insulating layer on the pad, at least one contact hole exposing a portion of the pad, the insulating Layer covering a middle portion of the pad and a pad terminal connected to the pad through the at least one contact hole.

27 Claims, 13 Drawing Sheets

LIQUID CRYSTAL DISPLAY DEVICE AND A METHOD FOR MANUFACTURING THE SAME

BACKGROUND OF THE INVENTION

1. Field of the Invention

The present invention relates to an active matrix display panel (or active panel) used for a liquid crystal display device (or LCD) and a method of manufacturing the same. More specifically, the present invention relates to a method for manufacturing an active panel in which a structure of a gate pad and a source pad connected to a gate line and a source line, respectively, is arranged to protect against damage to the gate pad caused by a probe pin during an auto probe process done for testing quality of the active panel.

2. Description of Related Art

A CRT (Cathode Ray Tube) has recently been replaced by a thin flat panel display device because the thin flat panel display device is thinner and lighter than the CRT such that the thin flat panel display can be used in any space. Active research activities have focused on developing liquid crystal display devices because of the high resolution and fast response time suitable for display of motion pictures which are achieved by liquid crystal display devices. Furthermore, the active panel comprising an active switching element such as a thin film transistor (or TFT) is more frequently applied to the LCD.

The general structure of the active panel having a plurality of TFTs is shown in FIG. 1. A plurality of gate lines 13 extending in a horizontal direction are arranged in a column direction so as to be parallel to each other and a plurality of source lines 23 are arranged to extend vertically in the row direction parallel to each other. The gate lines 13 and source lines 23 are provided on a transparent insulating substrate 1 such as a non-alkalic glass. A gate pad 15 and a source pad 25 are located at each end of the gate lines 13 and source lines 23. The TFT includes a gate electrode 11, a gate insulating layer (not shown), a semiconductor layer 33, a source electrode 21 and a drain electrode 31. The gate electrode 11 of the TFT extends from the gate line 13 and the source electrode 21 is extends from the source line 23. The drain electrode 31 is electrically connected to a pixel electrode 41 located at the area surrounded by each gate line 13 and each source line 23.

FIGS. 2–4 are cross-sectional views along section lines II—II, III—III and IV—IV of FIG. 1, respectively, and illustrate a method of manufacturing a conventional active panel.

Aluminum or an aluminum alloy is deposited on a transparent insulating substrate 1 using a sputtering process in order to form an aluminum layer. A low resistance gate line 13a and a low resistance gate pad 15a (hereinafter referred to as a first gate pad 15a) are formed by patterning the aluminum layer using a photolithography process. The low resistance gate line 13a extends along a row direction of the pixel array A plurality of the low resistance gate lines 13a are arranged in a column direction of the pixel array The first gate pad 15a is formed at each low resistance gate line 13a, as shown in FIGS. 2a and 3a.

A gate electrode 11, a gate line 13 and a second gate pad 15 are formed by depositing a metal layer including at least one of chromium, molybdenum, tantalum or antimony and also by patterning the metal layer. In contrast to the first gate pad 15a, the second gate pad is not formed of a low resistance metal but instead is formed of one of the highly reflective metals such as chromium, molybdenum, tantalum or antimony. The gate line 13 is arranged so as to cover the lower resistance gate line 13a. The gate electrode 11 extends from the gate line 13 and is arranged at one corner of the pixel array. The second gate pad 15 is arranged to cover the first gate pad 15a and to be electrically connected to the gate line 15, as shown in FIGS. 1, 2b and 3b.

A gate insulating layer 17 is formed by depositing a silicon nitride ($SiN_x$) or silicon dioxide ($SiO_2$) on the substrate using a chemical vapor deposition (CVD) process, as shown in FIGS. 2c, 3c and 4a.

As shown in FIGS. 1 and 2d, a semiconductor layer 33 and a doped semiconductor layer 35 are formed by depositing an amorphous silicon and n+ amorphous silicon layer sequentially on the gate insulating layer 17 using a CVD and then patterning these layers using a photo-lithography technique The semiconductor layer 33 defines a channel layer. The doped semiconductor layer 35 helps the source electrode 21 and the drain electrode 31, which are formed later, to be in ohmic contact with the semiconductor layer 33.

A source electrode 21, a drain electrode 31, a source line 23 and a source pad 25 are formed by depositing chromium or a chromium alloy to form a chromium layer using a sputtering method and then patterning the chromium layer using a photolithography technique. Then, the exposed doped semiconductor layer 35 located between the source electrode 21 and the drain electrode 31 is removed by using a dry etching method while using the source electrode 21 and the drain electrode 31 as a mask. The source electrode 21 is overlapped with one side of the gate electrode 11 located between the doped semiconductor layer 35. The drain electrode 31 facing the source electrode 21 is overlapped with the other side of the gate electrode 11 between the doped semiconductor layer 35. The source line 23 extends along a column direction of the pixel array and a plurality of source lines 23 are arranged at intervals along the row direction. The source pad 25 is formed at the end of the source line 23, as shown in FIGS. 1, 2e and 4b.

A passivation layer 37 is formed by depositing a silicon nitride material on the resulting substrate using a CVD process A drain contact hole 71, a gate contact hole 59 and a source contact hole 69 are formed by patterning the passivation layer 37 using a photolithography process. The drain contact hole exposes a portion of the drain electrode 31. The gate contact hole 59 and the source contact hole 69 expose a portion of the second gate pad 15 and the source pad 25, respectively, as shown in FIGS. 1, 2f, 3d and 4c.

Finally, a pixel electrode 41, a gate pad terminal 57 and a source pad terminal 67 are formed by depositing and patterning a transparent conductive material such as an indium-tin-oxide (or ITO) on the passivation layer 37. The pixel electrode 41 is electrically connected to the drain electrode 31 through the drain contact hole 71. The gate pad terminal 57 and the source pad terminal 67 are connected to the second gate pad 15 and the source pad 25 through the gate contact hole 59 and the source contact hole 69, respectively, as shown in FIGS. 1, 2g, 3e and 4d.

The structure of the conventional active panel of an LCD manufactured according to the method described above includes a gate electrode 11 made of at least one of chromium, molybdenum, tantalum or antimony and is disposed on a transparent insulating substrate 1. A gate insulating layer 17 comprising silicon nitride or silicon oxide covers the surface of the substrate 1 including the gate electrode 11. A semiconductor layer 33 is formed on the gate insulating layer 17 so as to cover the gate electrode 11. Two doped semiconductor layers 35 including an impurity doped semiconductor material made of phosphorous, such as an n+ amorphous silicon, are formed on the two sides of the semiconductor layer 33. A source electrode 21 and a drain electrode 31 including chromium or molybdenum are formed on the two doped semiconductor layers 35. A passivation layer 37 is formed on the substrate 1 including the source electrode 21 and the drain electrode 31. The drain electrode 31 is electrically connected to the pixel electrode 41 including an ITO through the drain contact hole 71.

The first gate pad 15a made of low resistance material such as aluminum is formed on the substrate 1. A second gate pad 15 including at least one of chromium, molybdenum, tantalum or antimony is formed on the first gate pad 15a. A gate insulating layer 17 and a passivation layer 37 exposing a portion of a surface of the second gate pad 15 is formed so as to cover other parts of the substrate 1. A gate pad terminal 57 including an ITO used for the pixel electrode 41 is connected to the exposed surface of the gate pad 15.

The gate insulating layer 17 including silicon nitride is formed on a transparent insulating layer 1. A source pad 25 including chromium is formed on the gate insulating layer 17. The passivation layer 37 exposing a portion of the surface of the source pad 25 is formed so as to cover other parts of the gate insulating layer 17. A source pad terminal 67 is connected to the exposed surface of the source pad 25.

Generally, after the active parel is completed, a test process is performed using an auto probe process to determine whether any bus line of the active panel is shorted or open. During the auto probe process, a damaged or defective active panel can be detected by connecting probe pins to each pad and applying a voltage signal to the pads through the pins. During the auto probe process, the gate pad made of aluminum and the gate pad terminal made of an ITO can be damaged by the pressure or contact of the probe pins. This may result in damage such as scratching or tearing off of the gate pad and gate pad terminal during the auto probe process. Also, when the TAB repairing process is performed, the gate pad can also be damaged. Even if a probe pin only contacts the second gate pad 15 and does not directly contact the first gate pad 15a made of low resistance material, the force applied by the probe pin may be sufficient to tear away or damage the low resistance material forming the first gate pad 15a.

In one actual experiment, when the first gate pad is made of aluminum with 2000 Å thickness, the second gate pad is made of molybdenum with 1000 Å thickness and the gate pad terminal is made of ITO with 500 Å thickness, the number of damaged pads was 20 in a test batch of 392 such that the damage rate is about 5%. Thus, it was determined that the aluminum layer included in the first gate pad has too soft of material to avoid damage during the auto probe process. Therefore, the soft aluminum material used in the first gate pad does not resist contact pressure of the probe pin sufficiently and as a result, the aluminum material is easily scratched or peeled off. If the gate pad has any defect after the testing is completed, the testing process can not detect such defect and the test process is useless.

SUMMARY OF THE INVENTION

To overcome the above-described disadvantages and problems, the preferred embodiments of the present invention provide a method for manufacturing an active panel which prevents damage to a gate pad caused by contact with a probe pin during a testing process.

In addition, preferred embodiments of the present invention provide an active panel having a pad structure which prevents damage thereto caused by a probe pin during a testing process.

According to a preferred embodiment of the present invention, an active panel of an LCD includes a pad including a first conductive material, an insulating layer on the pad, at least one contact hole exposing a portion of the pad, a pad terminal connected to the pad through the at least one contact hole and including a second conductive material on the insulating layer.

Other features and advantages of the present invention will become apparent from the following description of preferred embodiments of the invention which refers to the accompanying drawings, wherein like reference numerals indicate like elements to avoid duplicative description.

DETAILED DESCRIPTION OF PREFERRED EMBODIMENTS

Figure 1:
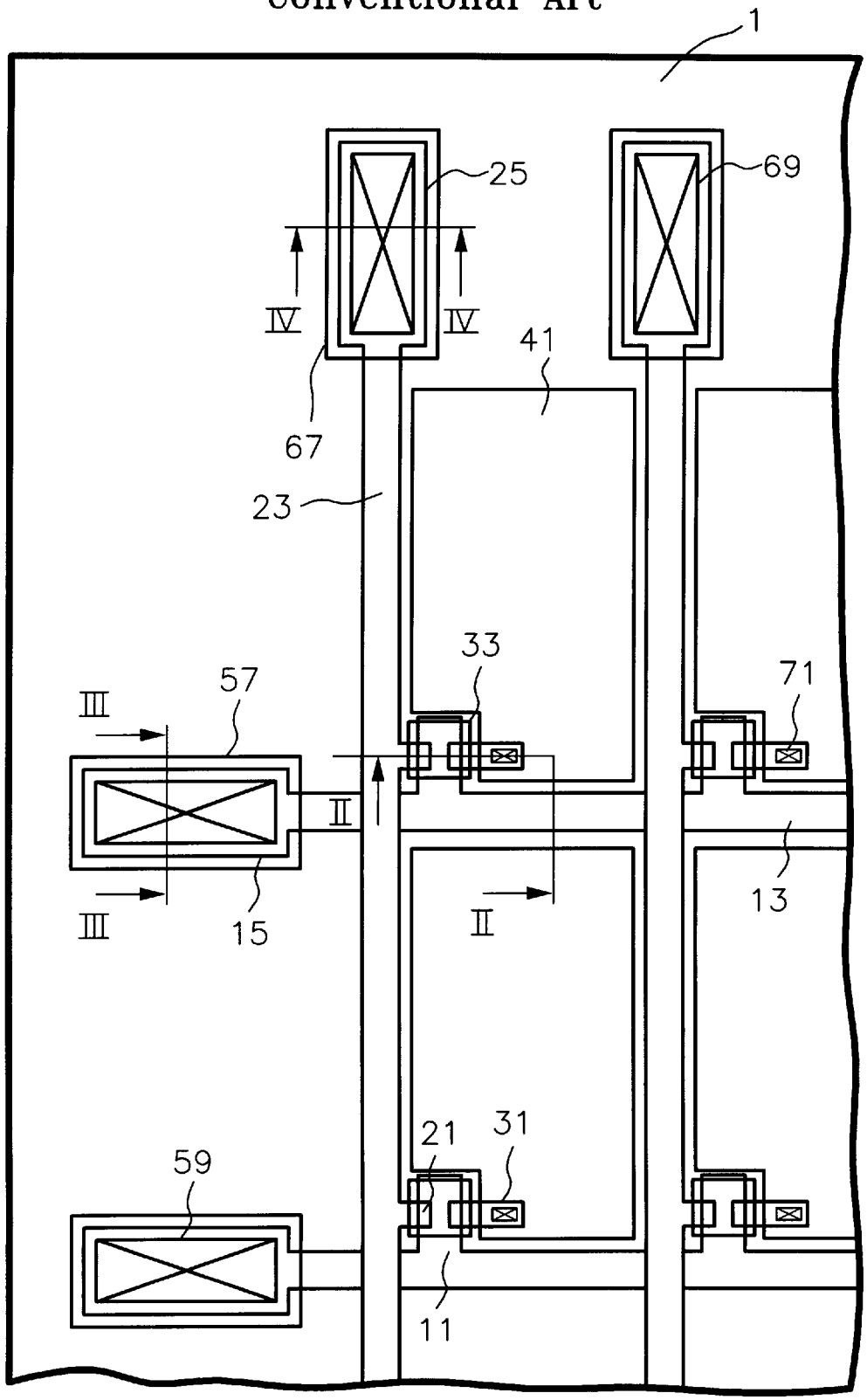
FIG. 1 is a plan view illustrating a conventional active matrix panel of an LCD.
Figure 2A:
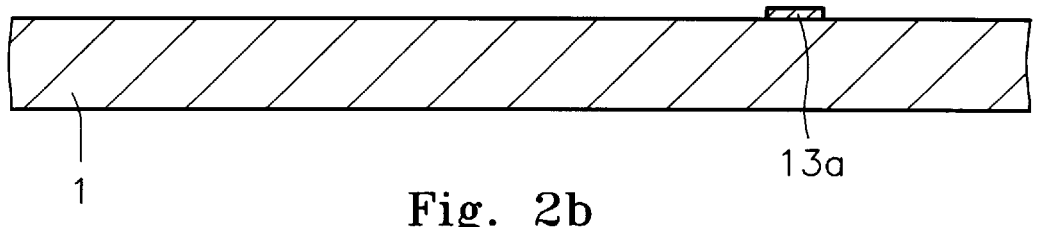
FIGS. 2a–2g are cross-sectional views along cutting lines II—II of FIG. 1 of the conventional TFT made according to a conventional method of manufacturing the active matrix panel of an LCD.
Figure 2B:
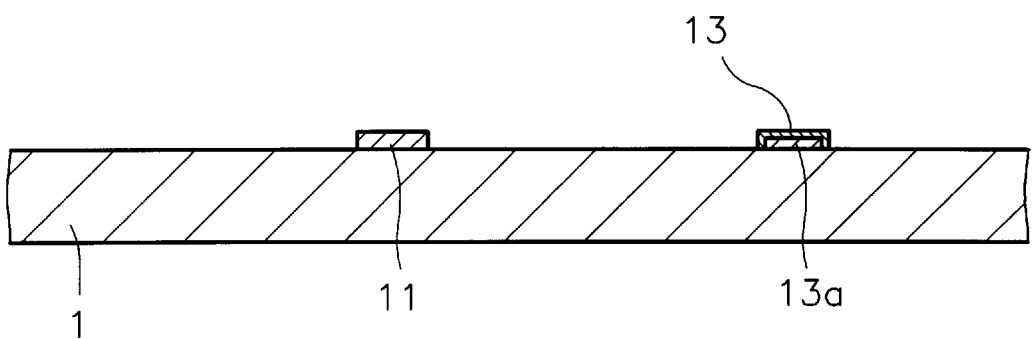
Figure 2C:
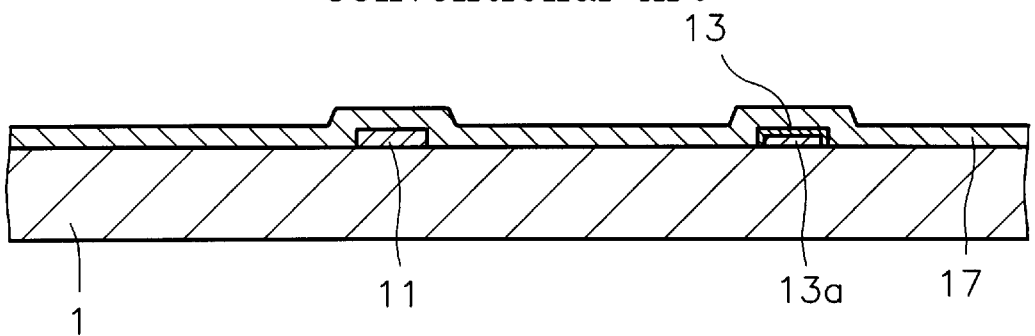
Figure 2D:
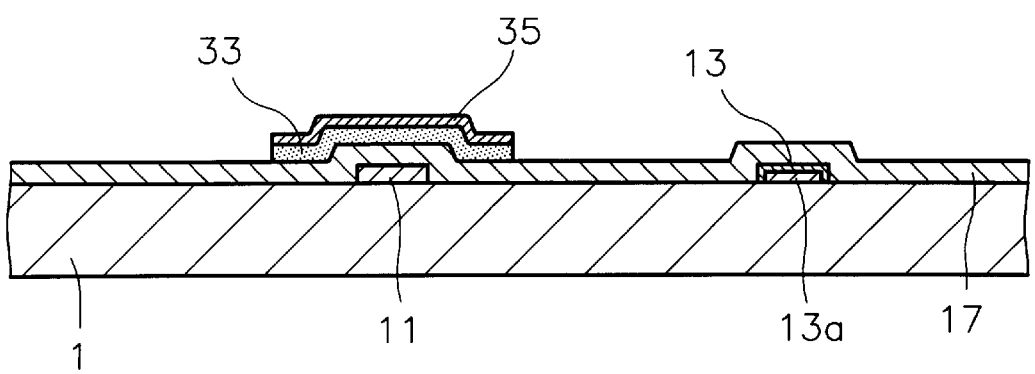
Figure 2E:
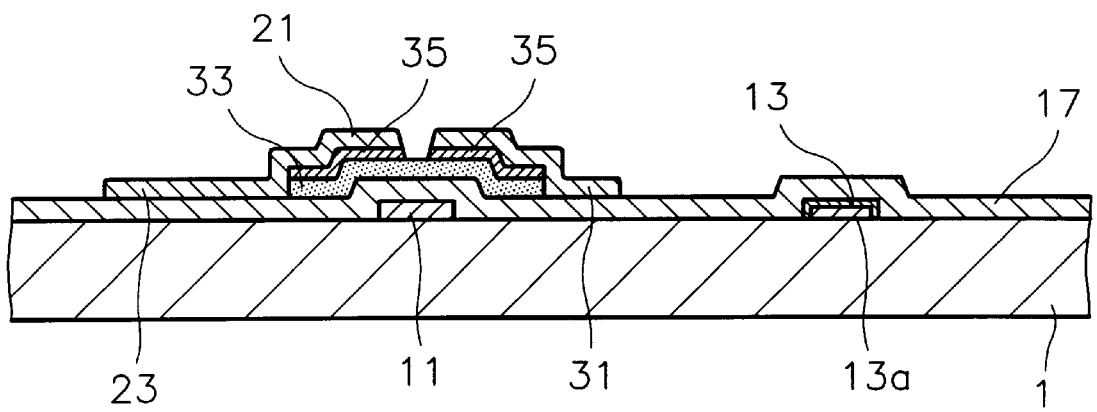
Figure 2F:
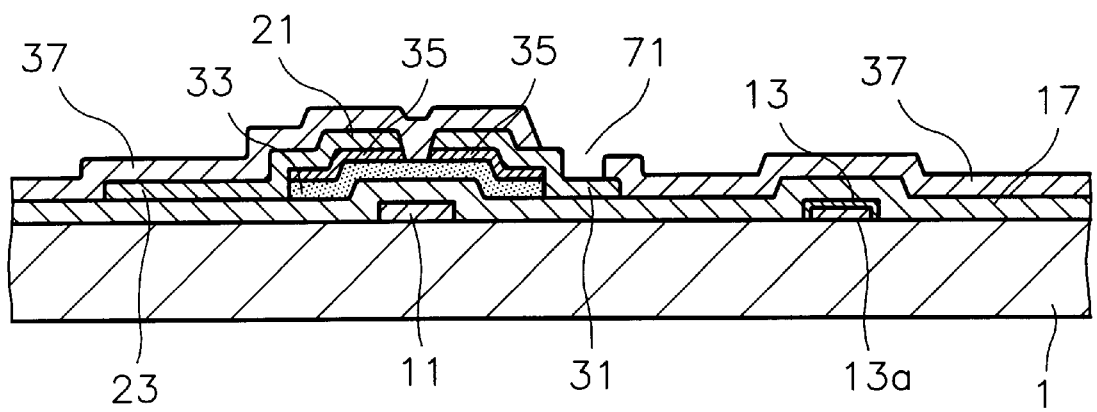
Figure 2G:
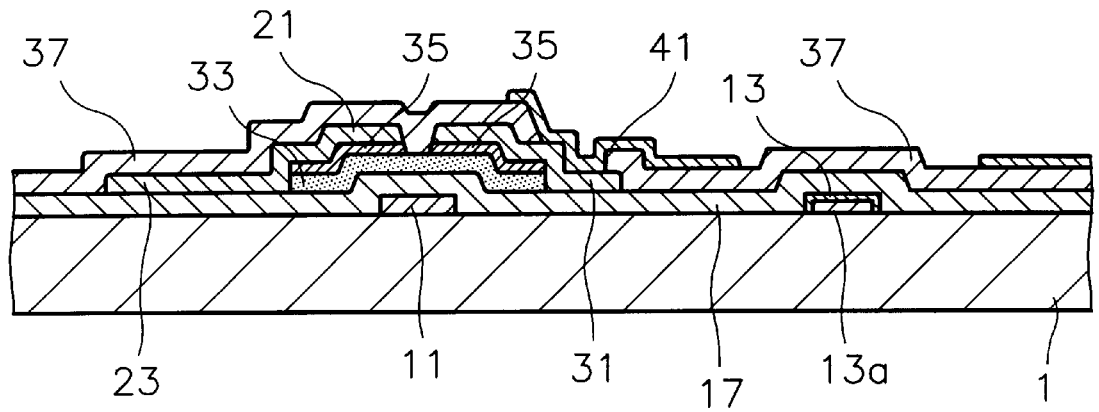
Figure 3A:
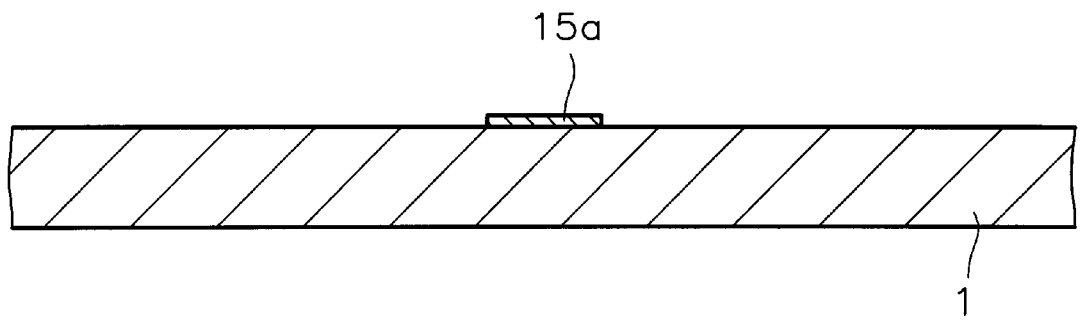
FIGS. 3a–3e are cross-sectional views along cutting lines III—III of FIG. 1 of the conventional TFT made according to a conventional method of manufacturing the active matrix panel of an LCD.
Figure 3B:
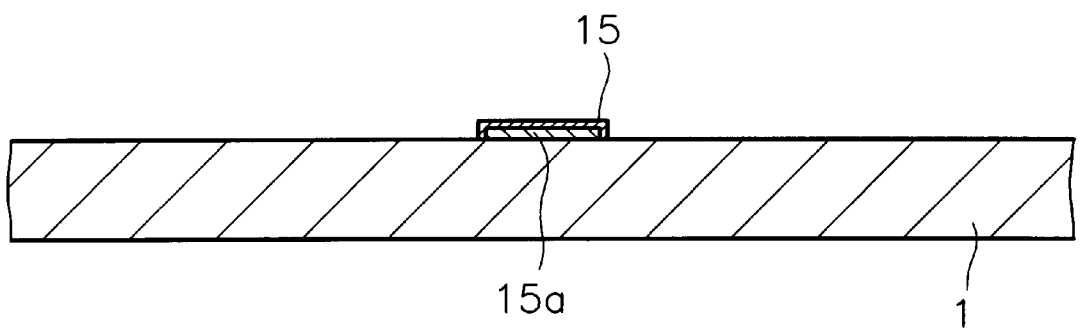
Figure 3C:
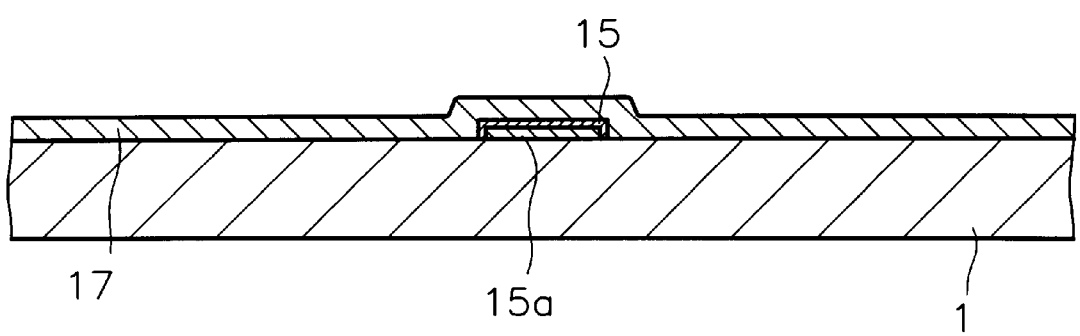
Figure 3D:
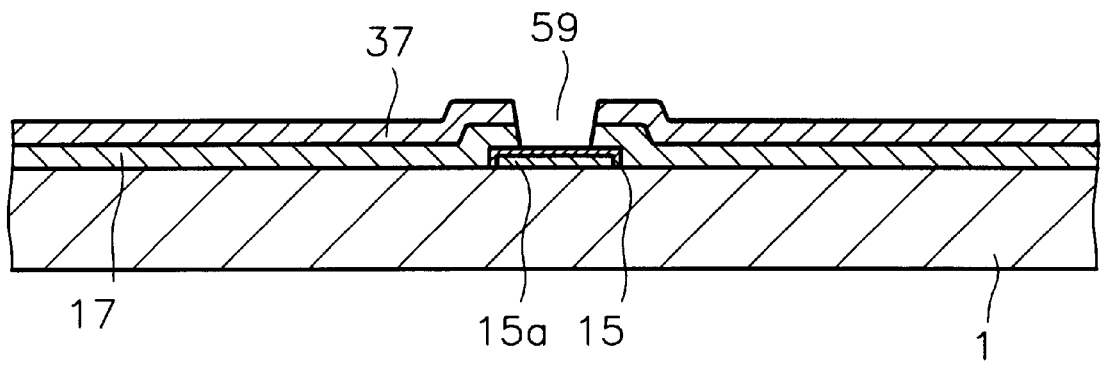
Figure 3E:
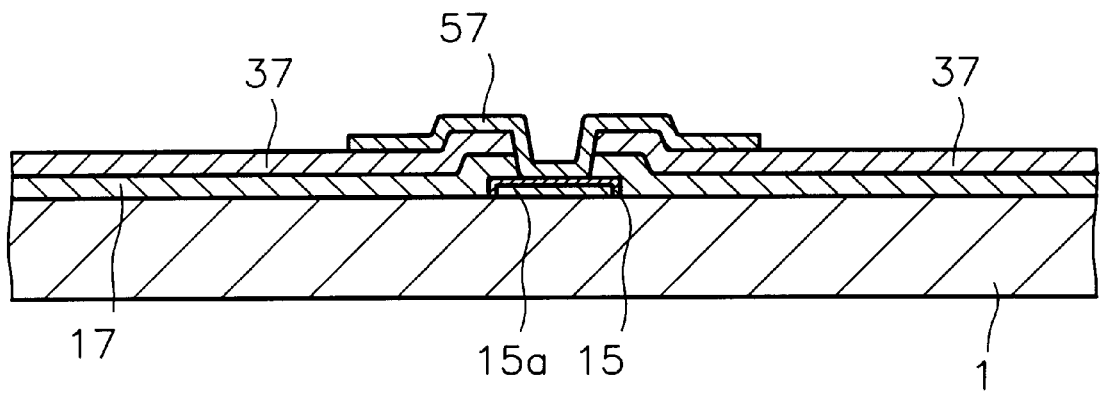
Figure 4A:
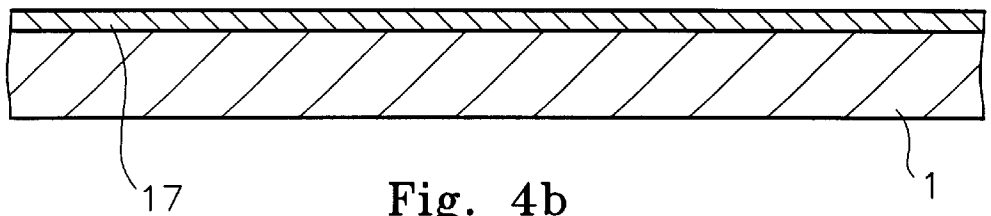
FIGS. 4a–4d are cross-sectional views along cutting lines IV—IV of FIG. 1 of the conventional TFT made according to a conventional method of manufacturing the active matrix panel of an LCD.
Figure 4B:
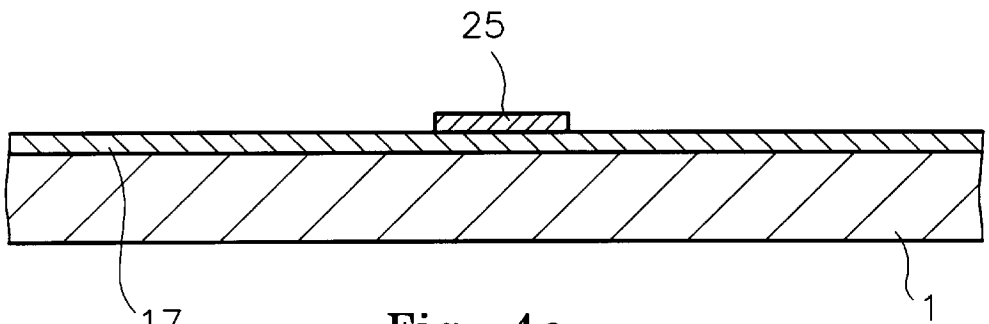
Figure 4C:
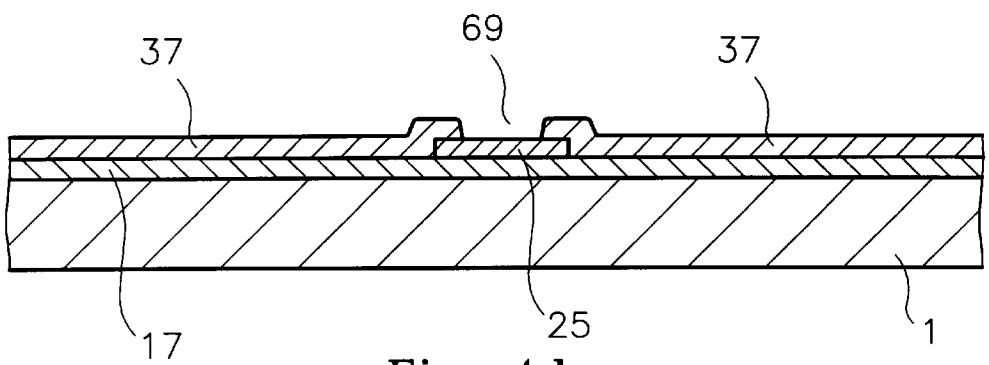
Figure 4D:
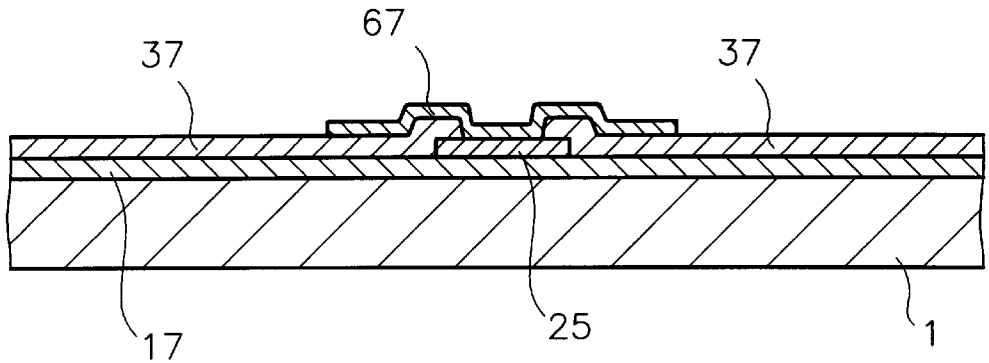
Figure 5:
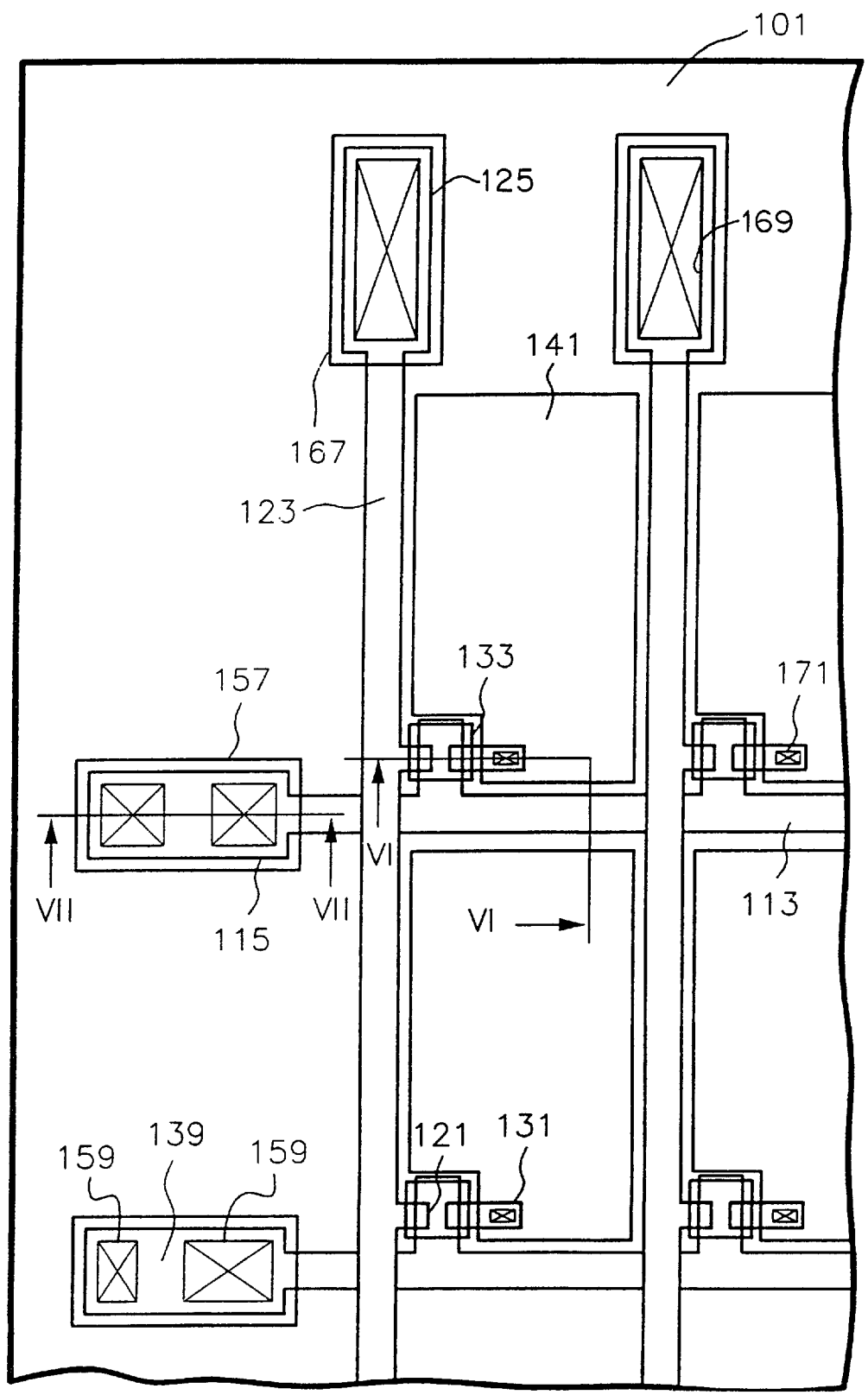
FIG. 5 is a plan view illustrating an active matrix panel of an LCD according to a preferred embodiment of the present invention.

Referring to preferred embodiments as shown in FIGS. 5–8, the gate pad and the source pad will be illustrated and explained in detail. FIG. 5 shows a plan view of an active panel according to a preferred embodiment of the present invention FIGS. 6a–6g illustrate cross-sectional views of the inventive TFT along cutting line VI—VI of FIG. 5 and FIGS. 7a–7e illustrate cross-sectional views of the inventive TFT along cutting line VII—VII of FIG. 5. The source pad is not explained in this preferred embodiment because it preferably has the same structure as the prior art structure described with reference to FIG. 1.

Figure 6A:
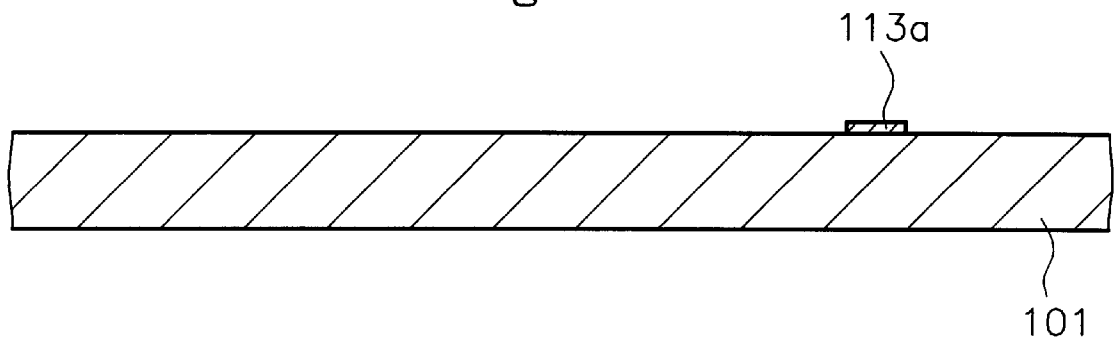
FIGS. 6a–6g are cross-sectional views along cutting lines VI—VI of FIG. 5 of the TFT made according to a preferred embodiment of a method of manufacturing the active matrix panel of an LCD.
Figure 6B:
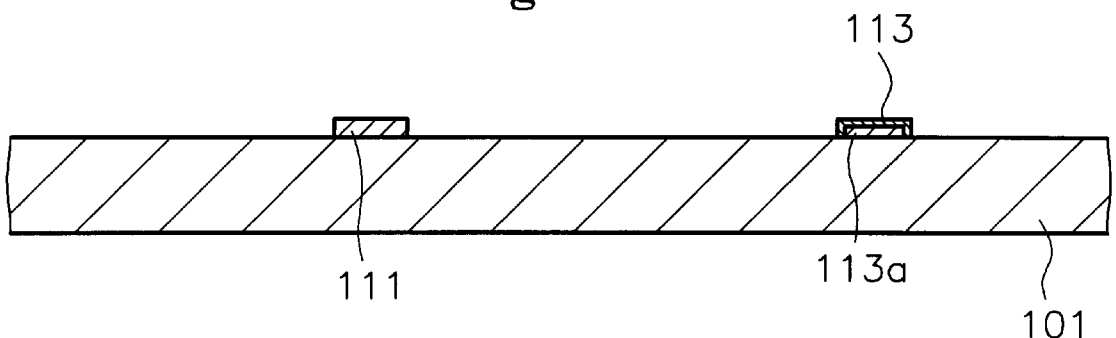
Figure 7A:
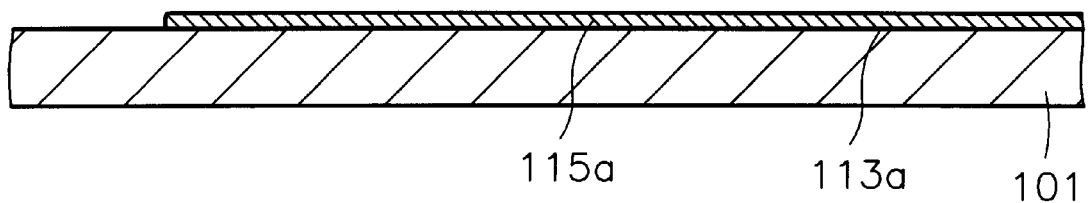
FIGS. 7a–7e are cross-sectional views along cutting lines VII—VII of FIG. 5 of the TFT made according to a preferred embodiment of a method of manufacturing the active matrix panel of an LCD.
Figure 7B:
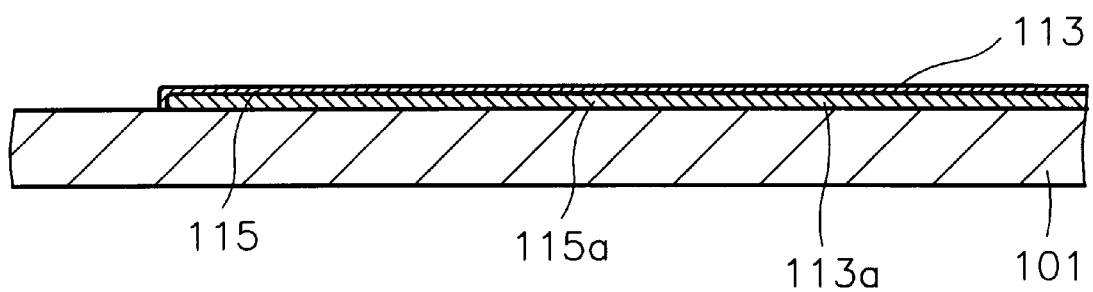

Aluminum or an aluminum alloy is deposited on a transparent insulating substrate 101 preferably by using a sputtering process in order to form an aluminum layer. A low resistance gate line 113a and a low resistance gate pad 115a (first gate pad) are formed preferably by patterning the aluminum layer using a photolithography process. The low resistance gate line 113a extends along a row direction of the pixel array. A plurality of the low resistance gate lines 113a are arranged in a column direction of the pixel array. The first gate pad 115a is formed at each low resistance gate line 113a, as shown in FIGS. 6a and 7a A gate electrode 111, a gate line 113 and a second gate pad 115 are formed preferably by depositing a metal layer including at least one of chromium (Cr) molybdenum (Mo) tantalum (Ta) or antimony (Sb) and also by patterning the metal layer. In contrast to the first gate pad 115a formed of low resistance material, the second gate pad 115 is formed of high reflective material such as chromium (Cr), molybdenum (Mo), tantalum (Ta) or antimony (Sb). The gate line 113 is arranged so as to cover the lower resistance gate line 113a. The gate electrode 111 extends from the gate line 113 and is arranged at one corner of the pixel array. The second gate pad 115 is arranged to cover the first gate pad 115a and be electrically connected to the gate line 113, as shown in FIGS. 5, 6b and 7b.

Figure 6C:
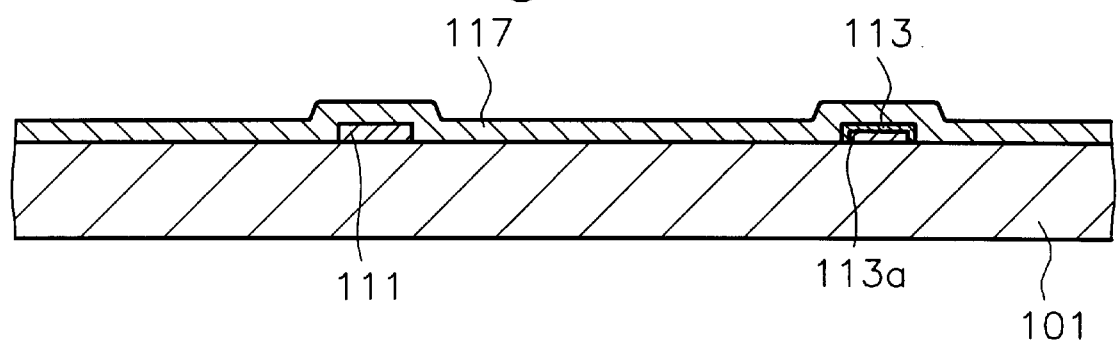
Figure 7C:
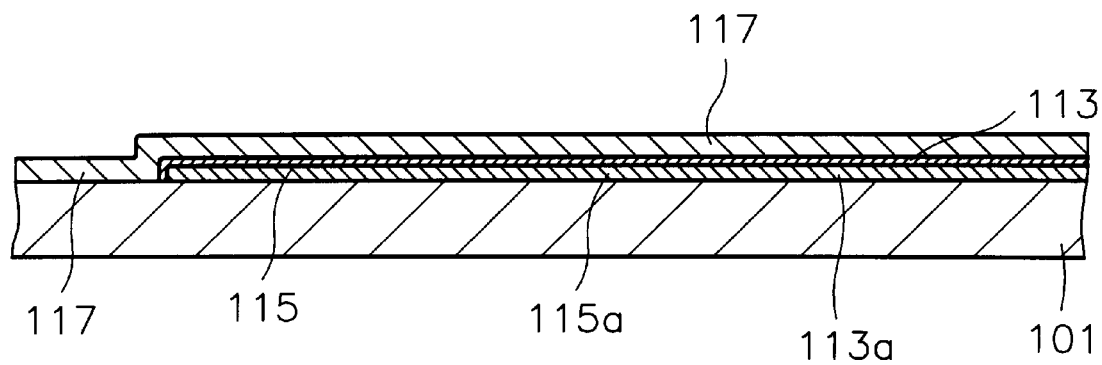

A gate insulating layer 117 is formed preferably by depositing a silicon nitride (SiN$_x$) or silicon dioxide (SiO$_2$) on the substrate using a chemical vapor deposition (CVD) process, as shown in FIGS. 6c and 7c.

Figure 6D:
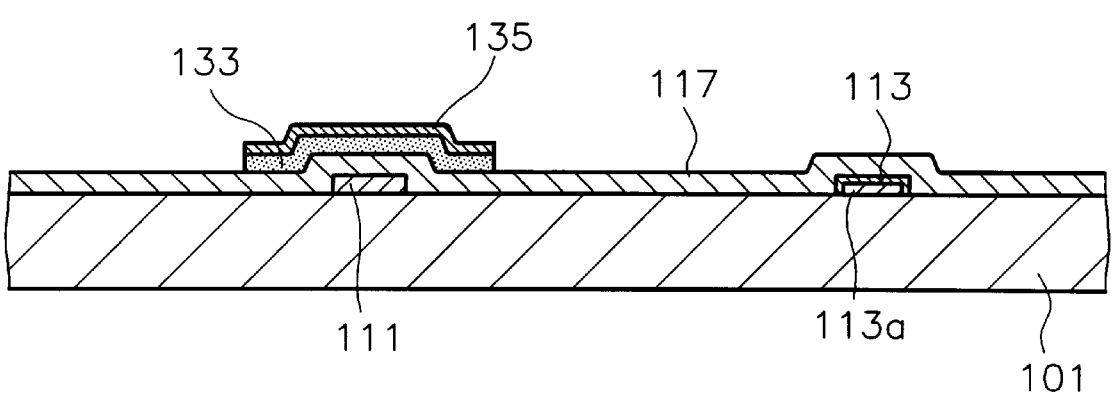

As shown in FIGS. 5 and 6d, a semiconductor layer 133 and a doped semiconductor layer 135 are formed preferably by depositing an amorphous silicon and n+ amorphous silicon layer sequentially on the gate insulating layer 117 using a CVD process and then patterning these layers using a photo-lithography technique. The semiconductor layer 133 defines a channel layer. The doped semiconductor layer 135 helps a source electrode 121 and a drain electrode 131, which are formed later, to be in ohmic contact with the semiconductor layer 133.

Figure 6E:
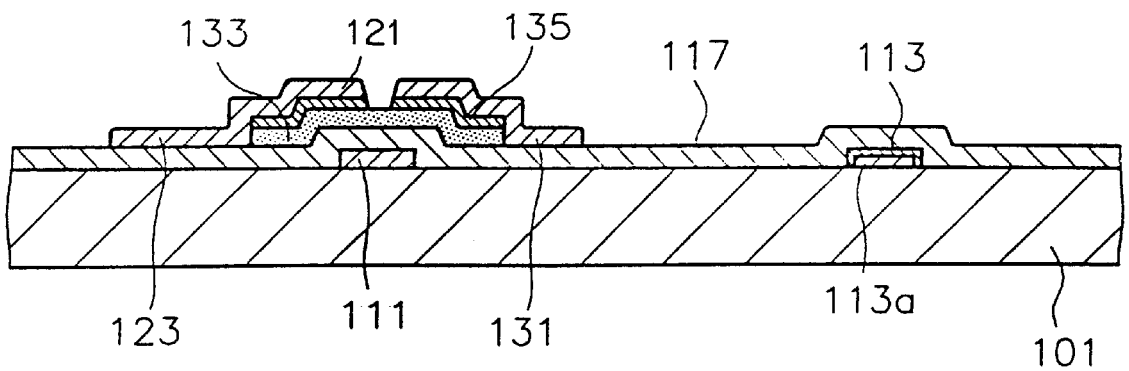

A source electrode 121, a drain electrode 131, a source line 123 and a source pad 125 are formed preferably by depositing chromium or a chromium alloy to form a chromium layer using a sputtering method and then patterning the chromium layer using a photolithography technique. Then, the exposed doped semiconductor layer 135 located between the source electrode 121 and the drain electrode 131 is removed by using a dry etching method while using the source electrode 121 and the drain electrode 131 as a mask. The source electrode 121 is overlapped with one side of the gate electrode 111 located between the doped semiconductor layer 135. The drain electrode 131 facing the source electrode 121 is overlapped with the other side of the gate electrode 111 between the doped semiconductor layer 135. The source line 123 extends along a column direction of the pixel array and a plurality of source lines 123 are arranged at intervals along the row direction The source pad 125 is formed at the end of the source line 123, as shown in FIGS. 5 and 6e.

A passivation layer 137 is formed preferably by depositing a silicon nitride material on the resulting substrate using a CVD process. A drain contact hole 171, a gate contact hole 159 and a source contact hole 169 are formed by patterning the passivation layer 137 using a photolithography process.

The gate contact hole 159 preferably comprises at least one hole and is preferably located at each end portion of the second gate pad 115 along a length direction thereof wherein the first gate pad 115a preferably has a substantially rectangular shape. Thus, the portion of the gate insulating layer 117 and the passivation layer 137 remaining on the middle of the second gate pad 115 forms a protective buffer layer 139 for protecting the second gate pad 115 and the first gate pad 115a made of low resistance material as described below.

Figure 6F:
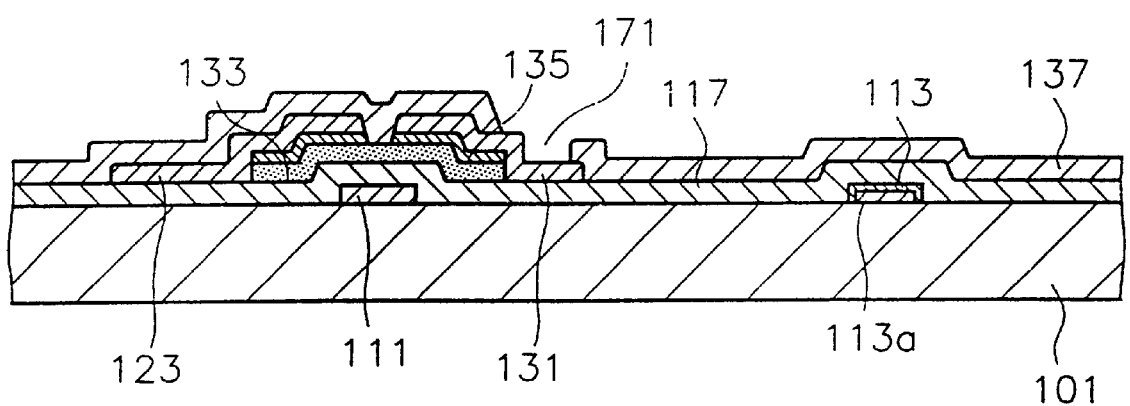
Figure 7D:
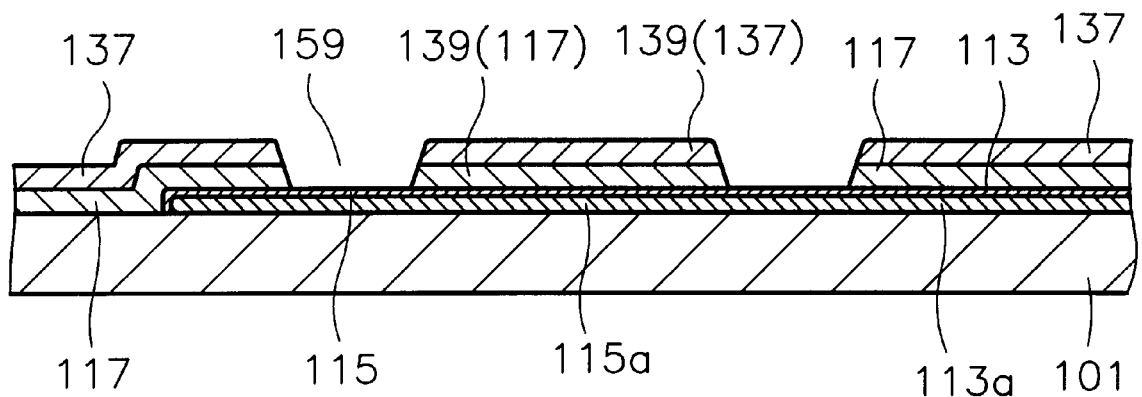

The drain contact hole 171 exposes a portion of the drain electrode 131. The gate contact hole 159 and the source contact hole 169 expose a portion of the second gate pad 115 and the source pad 125, respectively, as shown in FIGS. 5, 6f and 7d.

Finally, a pixel electrode 141, a gate pad terminal 157 and a source pad terminal 167 are formed by depositing and patterning a transparent conductive material such as an indium-tin-oxide (or ITO) on the passivation layer 137. The pixel electrode 141 is electrically connected to the drain electrode 131 through the drain contact hole 171.

Figure 6G:
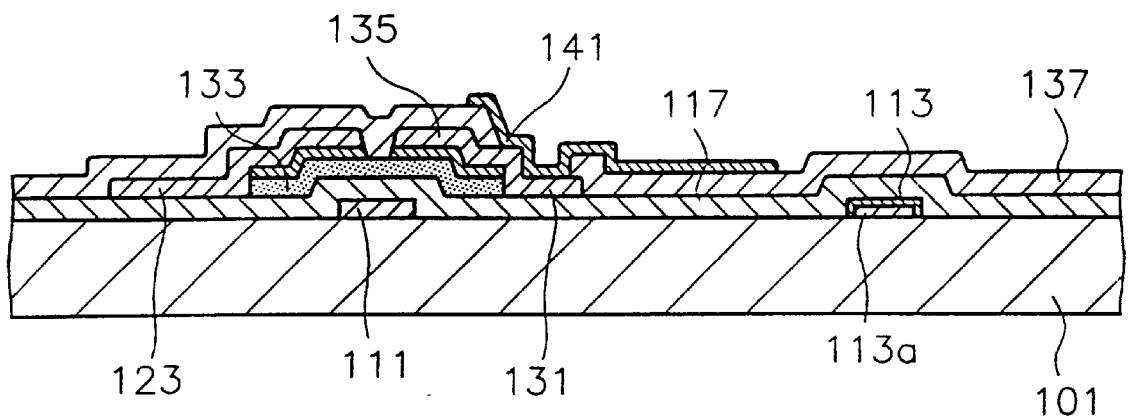
Figure 7E:
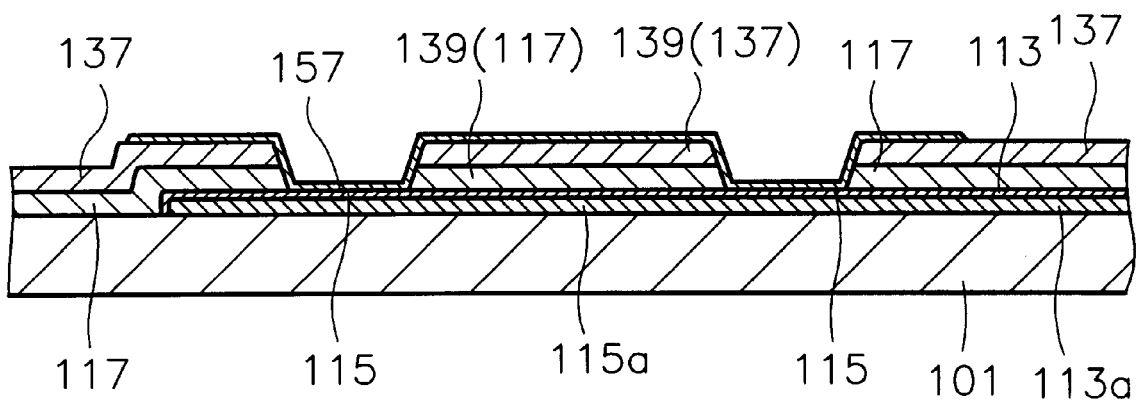
Figure 8:
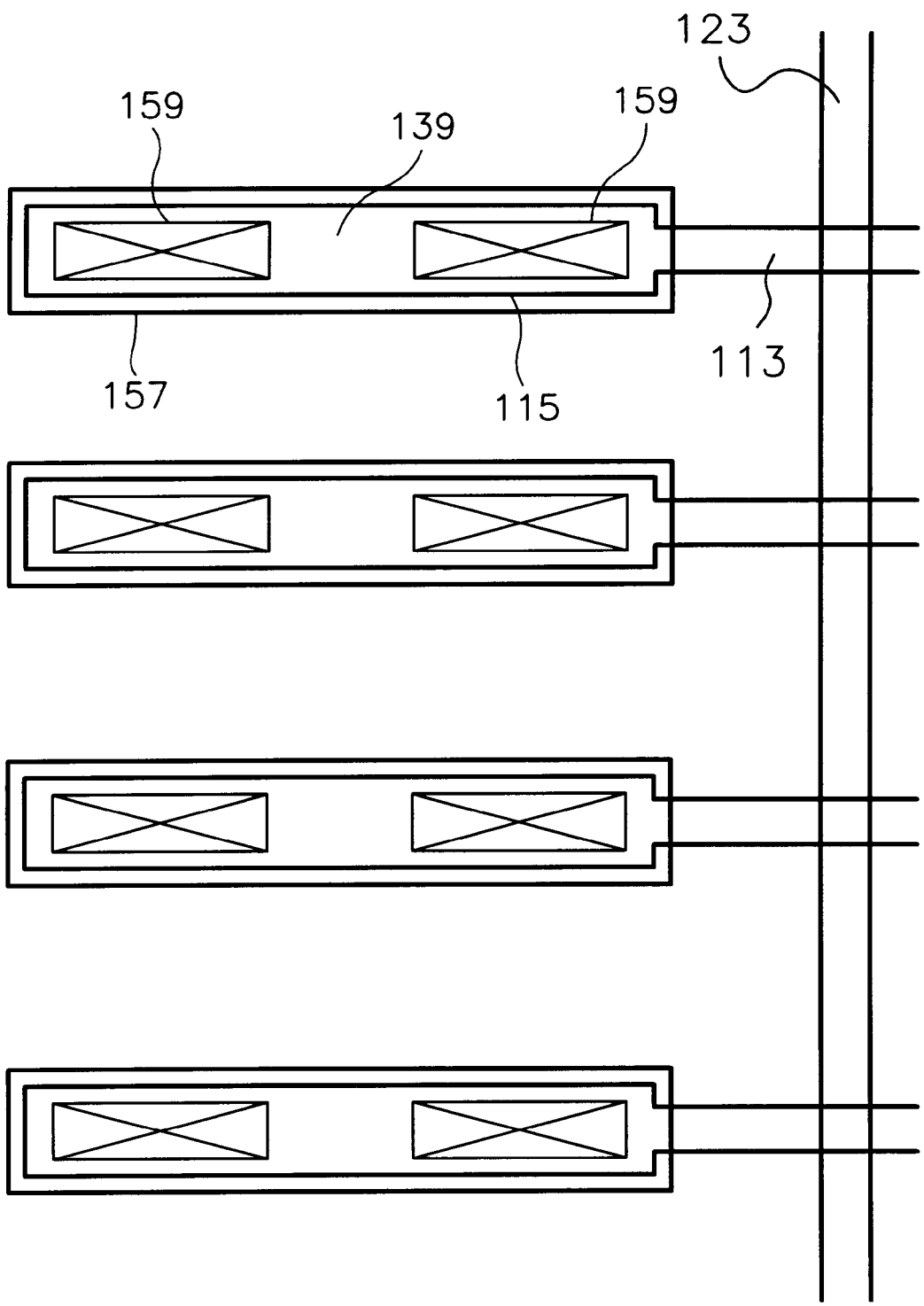
FIG. 8 is a plan view of array examples of a protective buffer layer on a gate pad according to a preferred embodiment of the present invention.

The gate pad terminal 157 is connected to the second gate pad 115 through the gate contact hole 159 and the source pad terminal 167 is connected to the source pad 125 through the source contact hole 169, as shown in FIGS. 5, 6g and 7e.

By disposing the protective buffer layer 139 over the middle of the gate pad which is the main portion of the gate pad that is contacted by the probe pin during auto probe processing, the first gate pad 115a and the second gate pad 115 are not damaged by the contact with the probe pin during the auto probe testing used to detect defects in the active panel. Thus, it is important that the protective buffer layer 139 be located at a position which will be contacted by the probe pins during auto probe testing.

Figure 9:
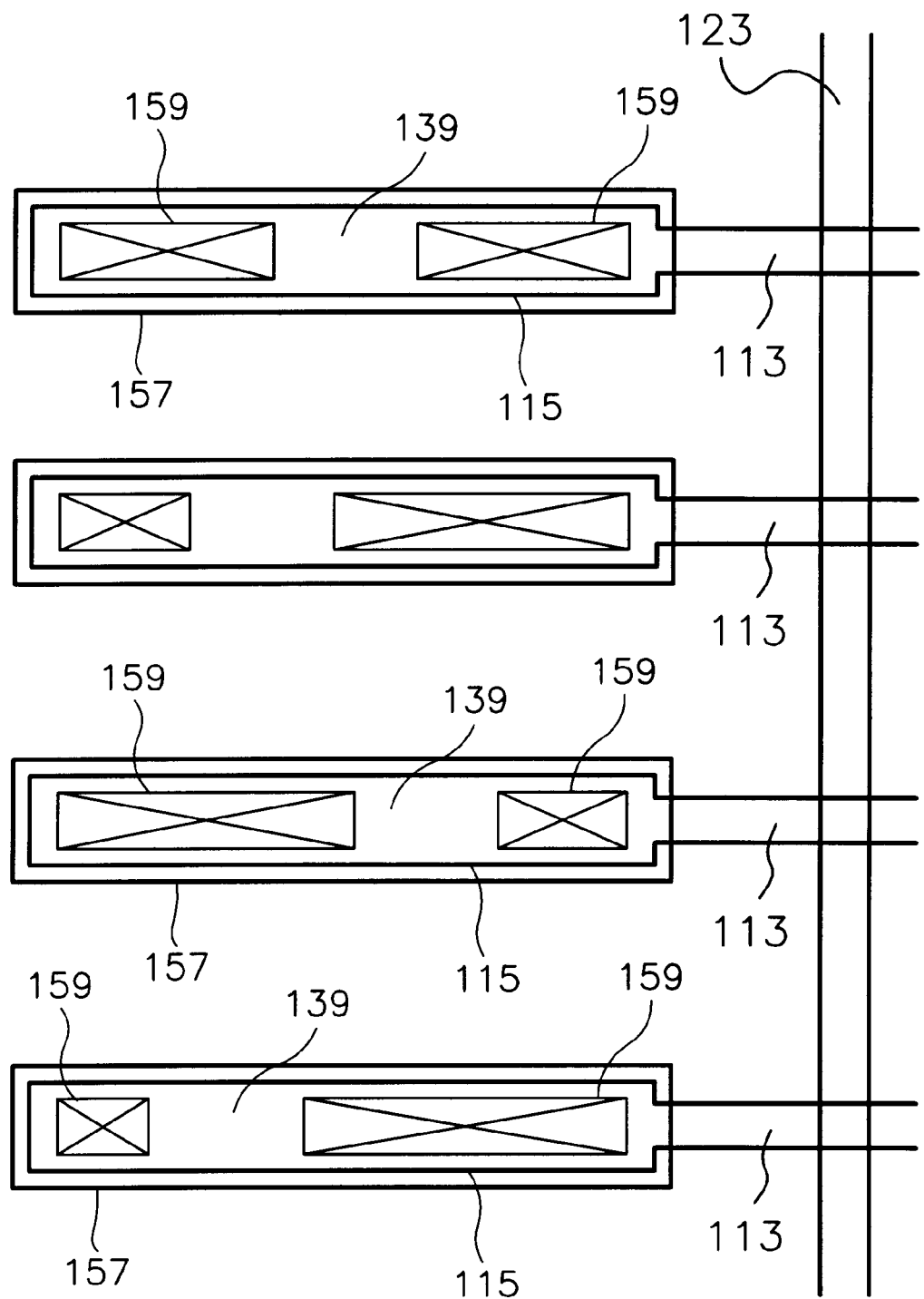

In the preferred embodiments described above, the proper position of protective buffer layer 139 will be explained in detail with reference to FIG. 9. In one example of preferred embodiments of the present invention, a second gate pad 115 has a substantially rectangular shape and has a length of about 1.8 mm to about 1.9 mm and a width of several mm. A probe pin of a testing machine is about 0.6 mm in length. The series of pins used in auto probe testing has a tolerance of about 1.2 mm. If the protective buffer layer 139 has a similar length as that of the second gate pad 115 so as to prevent the probe pin from contacting the protective buffer layer 139, then the size of the gate contact hole 159 is too small for the gate pad terminal to contact the second gate pad 115 with sufficient contact area. In such a case, the contact resistance is much higher than normal state at the second gate pad 115 which causes a significant decrease in picture quality produced on the LCD. Therefore, it is preferably that the length of the protective buffer layer 139 is similar to a length of a probe pin and that the protective buffer layer 139 is aligned with the probe pin contact area. Furthermore, the width of the protective buffer layer 139 is about one-quarter its length. Thus, the contact area should be of such a size and configuration to prevent an increase in contact resistance between the second gate pad 115 and the gate pad terminal 157. Furthermore, the array of a plurality of protective buffer layers 139 preferably is aligned in a column pattern so as to match the array of the probe pins. In an alternative embodiment, the array of a plurality of protective buffer layers 139 preferably has a zig-zag form so as to match the array of the probe pins arranged in a zig-zag pattern.

Thus, the structure according to preferred embodiments of the present invention includes a gate pad and at least one gate contact hole located at an end of the gate pad and a protective buffer layer including a portion of a gate insulating layer and a passivation layer disposed at a middLe of the gate pad. Therefore, the gate pad is protected from a contact pressure of a probe pin during auto probe testing to prevent any defect or damage to the gate pad during this testing process and to thereby significantly increase production yield.

While the invention has been particularly shown and described with reference to preferred embodiments thereof, it will be understood by those skilled in the art that the forgoing and other changes in form and details may be made therein without departing from the spirit of the invention.

What is claimed is:

1. A method of manufacturing a liquid crystal display, comprising:

forming gate pads on a substrate using a first conductive metal;

forming an insulating layer coveting the gate pads;

forming a passivation layer on the insulating layer; and forming an array of buffer layer, each buffer layer covering only a middle portion of each gate pad by patterning the passivation layer and the insulating layer such that opposite ends of each gate pad are not covered by the buffer layer, wherein the array of buffer layers is formed and arranged to have a zig-zag pattern.

2. The method according to claim 1, further comprising the step of simultaneously etching the passivation layer and the insulating layer.

3. The method according to claim 1, further comprising the step of forming a gate contact hole at each of the opposite ends of the gate pad so as to expose the opposite ends of the gate pad.

4. The method according to claim 1, wherein the buffer layer is arranged at a location of a probe pin contact area.

5. The method according to claim 1, wherein the zig-zag pattern of the array of buffer layers is arranged to match an array of probe pins.

6. The method according to claim 1, wherein a width of the buffer layer is about ¼ of a length of the buffer layer.

7. The method according to claim 1, further comprising the steps of forming a gate line connected to the gate pad and forming a gate electrode extending from the gate line.

8. The method according to claim 7, further comprising the steps of:

forming a semiconductor layer on the insulating layer on the gate electrode;

forming two separate doped semiconductor layers on the semiconductor layer;

forming a source pad, a source line connected to the source pad, a source electrode extending from the source line and connected to one of the two doped semiconductor layers and a drain electrode facing the source electrode and connected to the other of the two doped semiconductor layers.

9. The method according to claim 8, further comprising the steps of:

forming a drain contact hole exposing the drain electrode;

forming a source contact hole exposing the source pad;

forming a pixel electrode connected to the drain electrode through the drain contact hole; and forming a source pad terminal connected to the source pad through the source contact hole.

10. The method according to claim 1, wherein the first conductive metal comprises a first metal layer and a second metal layer.

11. The method according to claim 10, wherein the first metal layer comprises aluminum.

12. The method according to claim 10, wherein the second metal layer comprises at least one of chromium, molybdenum, tantalum and antimony.

13. A method of manufacturing a liquid crystal display, comprising:

forming a gate pad on a substrate using a conductive metal; and forming a buffer layer covering a middle portion of the gate pad, wherein a width of the buffer layer is about ¼ of a length of the buffer layer.

14. The method according to claim 13, wherein forming a buffer layer comprises:

forming an insulating layer over the gate pad;

forming a passivation layer over the insulating layer; and patterning the insulating layer and passivation layer to expose opposite ends of the gate pad, leaving a middle portion of the gate pad covered.

15. The method according to claim 13, comprising forming a plurality of gate pads and forming a plurality of buffer layers covering respective middle portions of the gate pads.

16. The method according to claim 14, wherein patterning the insulating layer and passivation layer comprises simultaneously etching the insulating layer and passivation layer.

17. The method according to claim 13, wherein forming a buffer layer comprises foiling gate contact holes exposing opposite ends of the gate pad.

18. The method according to claim 13, wherein the buffer layer covers a probe pin contact area.

19. The method according to claim 15, wherein the plurality of buffer layers are arranged in a straight line with respect to each other.

20. The method according to claim 15, wherein the plurality of buffer layers are arranged in a zig-zag pattern with respect to each other.

21. The method according to claim 20, wherein the zig-zag pattern of the buffer layers corresponds to an array of probe pins.

22. The method according to claim 13, further comprising forming a gate line electrically connected to the gate pad and a gate electrode extending from the gate line, the insulating layer and the passivation layer being formed over the gate line and gate electrode.

23. The method according to claim 22, further comprising:

forming a semiconductor layer on the insulating layer over the gate electrode;

forming first and second doped semiconductor layers on the semiconductor layer; and forming a source pad, a source line electrically connected to the source pad, a source electrode extending from the source line and electrically connected to the first doped semiconductor layer, and a drain electrode opposite the source electrode and electrically connected to the second doped semiconductor layer.

24. The method according to claim 23, further comprising:

forming a drain contact hole exposing the drain electrode;

forming a source contact hole exposing the source pad;

forming a pixel electrode electrically connected to the drain electrode through the drain contact hole; and forming a source pad terminal connected to the source pad through the source contact hole.

25. The method according to claim 13, wherein the conductive metal comprises first and second metal layers.

26. The method according to claim 25, wherein the first metal layer comprises aluminum.

27. The method according to claim 25, wherein the second metal layer comprises at least one of chromium, molybdenum, tantalum, and antimony.

* * * * *